United States Patent
Kim et al.

(10) Patent No.: US 7,340,005 B2
(45) Date of Patent: Mar. 4, 2008

(54) SIGNAL TRANSMISSION APPARATUS AND METHOD

(75) Inventors: Wang-Rae Kim, Gyeonggi-Do (KR); Kwang-Eun Ahn, Gyeonggi-Do (KR); Woo-Sik Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 707 days.

(21) Appl. No.: 10/862,108

(22) Filed: Jun. 3, 2004

(65) Prior Publication Data

US 2004/0252783 A1    Dec. 16, 2004

(30) Foreign Application Priority Data

Jun. 12, 2003  (KR)  .................... 10-2003-0037904
Jun. 12, 2003  (KR)  .................... 10-2003-0037972

(51) Int. Cl.
  *H04K 1/02*  (2006.01)
  *H04L 25/03*  (2006.01)
  *H04L 25/49*  (2006.01)

(52) U.S. Cl. ...................................................... 375/296

(58) Field of Classification Search ................ 375/224, 375/285, 296–297
See application file for complete search history.

(56) References Cited

U.S. PATENT DOCUMENTS

| | | | |
|---|---|---|---|
| 5,740,520 A * | 4/1998 | Cyze et al. ................... | 455/69 |
| 6,141,390 A * | 10/2000 | Cova .......................... | 375/297 |
| 6,591,090 B1 * | 7/2003 | Vuorio et al. ............... | 455/126 |
| 6,614,854 B1 * | 9/2003 | Chow et al. ................ | 375/297 |
| 6,756,845 B1 * | 6/2004 | Mashhour .................... | 330/149 |
| 6,985,704 B2 * | 1/2006 | Yang et al. ................. | 455/126 |
| 6,993,090 B2 * | 1/2006 | Kusunoki .................... | 375/296 |
| 6,996,378 B2 * | 2/2006 | Helms ......................... | 455/91 |
| 7,215,716 B1 * | 5/2007 | Smith ......................... | 375/296 |

\* cited by examiner

*Primary Examiner*—Jean B Corrielus
(74) *Attorney, Agent, or Firm*—Lee, Hong, Degerman, Kang & Schmadeka

(57) ABSTRACT

A signal transmission apparatus comprises a plurality of look-up tables (LUTs) corresponding to operation areas of a nonlinear transmission device, an operational characteristic calculator, a LUT selector, and a predistorter. The LUTs are adapted to store gain values of input signal magnitudes. The LUT selector selects a LUT corresponding to a calculated operational characteristic. The selected LUT generates a gain value output signal. The predistorter generates a predistorted signal from the gain value output signal and an input signal. The predistorted signal is input to a nonlinear transmission device.

37 Claims, 10 Drawing Sheets

SIGNAL TRANSMISSION APPARATUS AND METHOD

CROSS-REFERENCE TO RELATED APPLICATIONS

Pursuant to 35 U.S.C. § 119(a), this application claims the benefit of earlier filing date and right of priority to Korean Patent Application No. 37904 and No. 37972, filed on Jun. 12, 2003, respectively, the contents of which are hereby incorporated by reference in their entirety.

BACKGROUND OF THE INVENTION

1. Field of the Invention

The present invention relates generally to the field of signal transmission and more particularly to a signal transmission apparatus adapted for use in conjunction with a nonlinear transmission device.

2. Description of the Related Art

In general, a nonlinear transmission device, such as a high power amplifier (HPA), amplifies an up-converted radio frequency signal and transmits the amplified signal to a receiving end. Since the HPA is generally implemented as an active device having nonlinear characteristics, an output signal inevitably includes a distortion component. Various linearizing techniques and algorithms, including feed forward, predistortion, envelope correction and bias compensation, have been introduced to improve the nonlinear characteristics of such active devices.

FIG. 1 illustrates a conventional signal transmission apparatus adapted to use predistortion and look-up table (LUT) linearization techniques. The apparatus includes a nonlinear transmission device 15, a single LUT 10 for storing a plurality of gain values for improving the nonlinear characteristics of nonlinear transmission device 15, an indexer 11 for addressing a gain value of LUT 10 according to the magnitude of an input signal (Vi[n]), a complex multiplier 12 which produces a predistorted output Vd[n] after processing input signal Vi[n] and the gain value outputted from LUT 10. Predistorted output Vd[n] is fed to nonlinear transmission device 15 via a digital-analog-converter (DAC) 13 and an up frequency converter (UR) 14.

A signal capture module (SCM) 18 stores predistorted output Vd[n] and the output (Vf[n]) from nonlinear transmission device 15. A digital signal processor (DSP) 19 is coupled between SCM 18 and LUT 10 and is used to update LUT 10. Nonlinear transmission device 15 is typically a HPA with complex multiplier 12 serving as a predistorting device. A down frequency converter (DC) 16 and an analog-to-digital converter (ADC) 17 are coupled between the output terminal of nonlinear transmission device 15 and SCM 18, as shown in FIG. 1.

LUT 10 generally includes N number of entries addressed by indexer 11 whereby each entry stores complex gain values. Indexer 11 calculates the magnitude of input signal Vi[n], addresses an entry of LUT 10 according to the calculated magnitude, and outputs a specific complex gain value (referred to as 'gain value', hereinafter).

Predistorter 12 multiplies input signal Vi[n] and the gain value output of LUT 10 to generate predistorted output signal Vd[n]. Nonlinear transmission device 15 amplifies the inputted Vd[n] to a predetermined level generating output signal Vf[n]. SCM 18 stores Vd[n] and Vf[n], as shown in FIG. 1. If DAC 13, UC 14, DC 16 and ADC 17 were to operate ideally, Vd[n] and (Vf[n]) would exhibit input/output characteristics of nonlinear transmission device 15, respectively. DSP 19 estimates the nonlinear characteristics of nonlinear transmission device 15 on the basis of inputted Vd[n] and Vf[n] and updates LUT 10 to compensate for the same accordingly. If DSP 19 repeatedly updates LUT 10, compensation values stored in each entry of LUT 10 would have completely reverse characteristics relative to the estimated nonlinear characteristics of nonlinear transmission device 15.

Thereafter, when a gain value stored in LUT 10 according to indexer 11 is outputted to predistorter 12 and multiplied with input signal Vi[n], the predistorted output signal Vd[n] would exhibit completely reverse characteristics relative to the nonlinear characteristics of nonlinear transmission device 15. Nonlinear transmission device 15 amplifies Vd[n] whereby its output Vf[n] does not include a distortion component, i.e., the nonlinearity of nonlinear transmission device 15 has been effectively compensated.

FIG. 2 is a graph showing conventional operational characteristics of nonlinear transmission device 15 according to operation area. Operation areas (of nonlinear transmission device 15) may be classified, for example, by operational power (P) level. Nonlinear transmission device 15 exhibits different nonlinear characteristics according to individual operational power levels (P1, P2, ..., PM) discriminating the various operation areas, as shown in FIG. 2.

If the operational characteristics of nonlinear transmission device 10 were linearized, performance would be degraded whenever the operation area changes. Such performance degradation may be resolved by updating the LUT according to the change in characteristics of nonlinear transmission device 10. However, performance degradation occurring during updating of the LUT cannot be avoided. Specifically, whenever the operation area of the nonlinear transmission device is quickly changed, performance is severely degraded.

SUMMARY OF THE INVENTION

In accordance with one aspect of the present invention, a signal transmission apparatus comprises a plurality of look-up tables (LUTs) corresponding to operation areas of a nonlinear transmission device, an operational characteristic calculator, a LUT selector, and a predistorer. The LUTs are adapted to store gain values of input signal magnitudes. The LUT selector selects a LUT corresponding to a calculated operational characteristic. The selected LUT generates a gain value output signal. The predistorter generates a predistorted signal from the gain value output signal and an input signal. The predistorted signal is input to a nonlinear transmission device.

In accordance with another aspect of the present invention, a signal transmission method comprises the steps of generating a plurality of look-up tables (LUTs) corresponding to operation areas of a nonlinear transmission device, the plurality of LUTs adapted to store gain values of input signal magnitudes; calculating an operational characteristic of the nonlinear transmission device from at least one input signal; selecting a LUT from the plurality of LUTs corresponding to the calculated operational characteristic, the selected LUT adapted to generate a gain value output signal; and generating a predistorted signal from the gain value output signal and the input signal. The predistorted signal is input to the nonlinear transmission device.

In accordance with yet another aspect of the present invention, a signal transmission method comprises the steps of generating a plurality of look-up tables (LUTS) corresponding to operation areas of a nonlinear transmission device, the plurality of LUTs adapted to store gain values of input signal magnitudes; calculating an operational characteristic of the nonlinear transmission device from at least one input signal; selecting a LUT from the plurality of LUTs corresponding to the calculated operational characteristic, the selected LUT adapted to generate a gain value output signal; processing the gain value output signal using at least one linear interpolation technique; and generating a predistorted signal from the processed gain value output signal and the input signal. The predistorted signal is input to the nonlinear transmission device.

These and other aspects of the present invention will become apparent from a review of the accompanying drawings and the following detailed description of the present invention.

BRIEF DESCRIPTION OF THE DRAWINGS

The present invention is generally shown by way of reference to the accompanying drawings as follows.

DETAILED DESCRIPTION OF THE PREFERRED EMBODIMENTS

Some embodiments of the present invention will be described in detail with reference to the related drawings of FIGS. 1-16. Additional embodiments, features and/or advantages of the invention will become apparent from the ensuing description or may be learned by practicing the invention.

In the figures, the drawings are not to scale with like numerals referring to like features throughout both the drawings and the description.

The following description includes the best mode presently contemplated for carrying out the invention. This description is not to be taken in a limiting sense, but is made merely for the purpose of describing the general principles of the invention.

Figure 1:
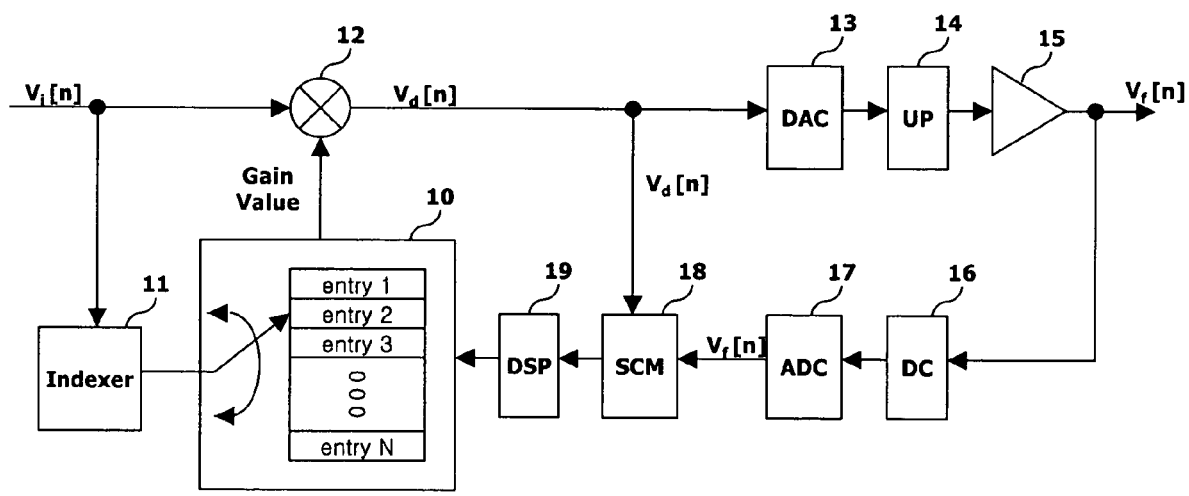
FIG. 1 illustrates a conventional signal transmission apparatus using a single look-up table (LUT).
Figure 2:
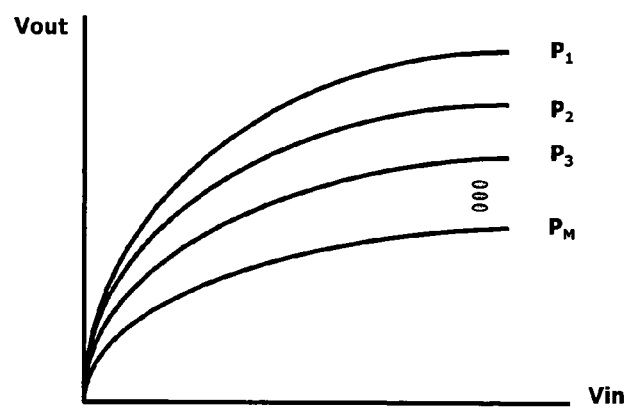
FIG. 2 is a graph showing characteristics of a nonlinear transmission device according to operational area.
Figure 3:
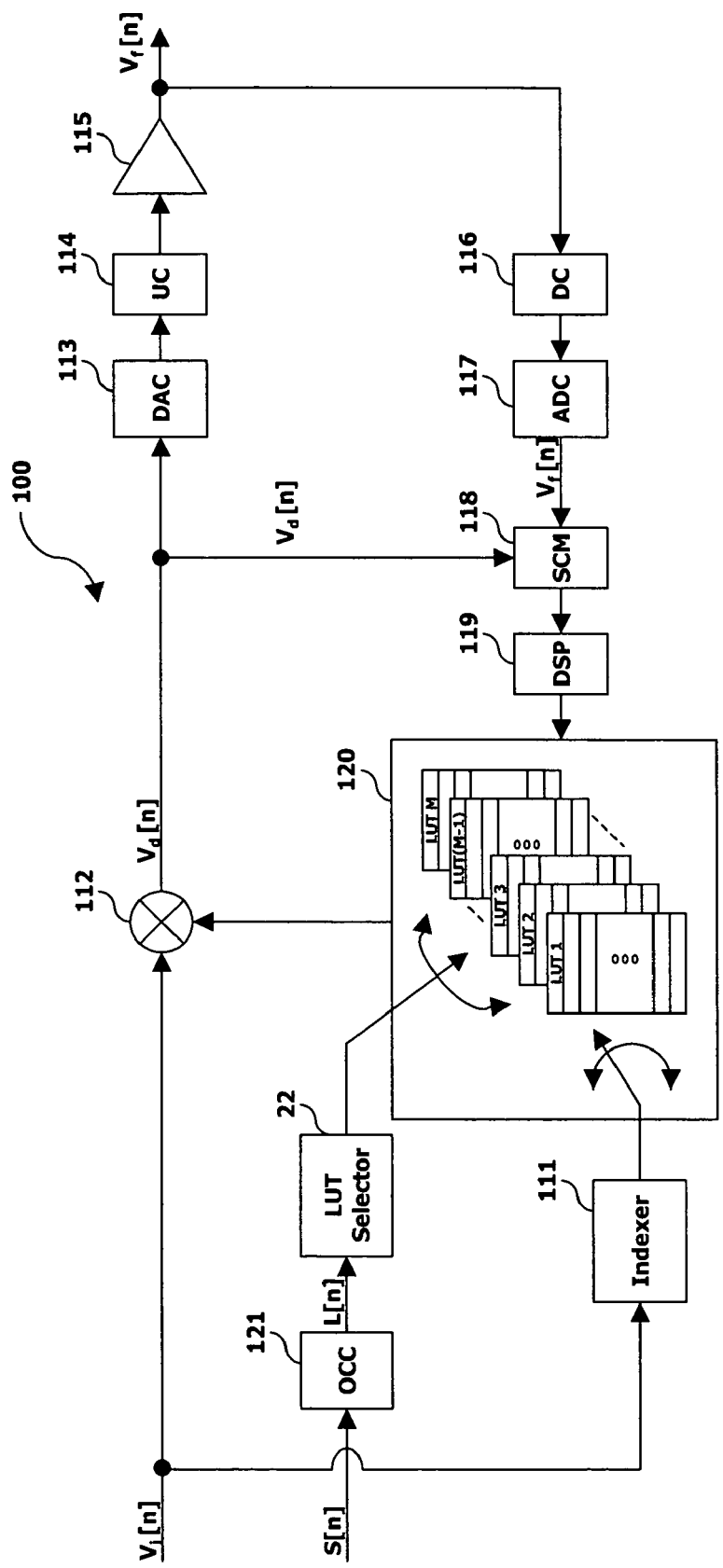
FIG. 3 schematically illustrates a signal transmission apparatus in accordance with one embodiment of the present invention.

FIG. 3 schematically illustrates a signal transmission apparatus 100 in accordance with a preferred embodiment of the present invention. Signal transmission apparatus 100 preferably comprises a plurality of look-up tables (LUTs) 120, instead of a single LUT as practiced in the prior art, an LUT selector 122 operatively coupled between LUTs 120, and an operational characteristic calculator (OCC) 121. Each of LUTs 120 corresponds to a respective operation area of a nonlinear transmission device 115. Each LUT includes N number of entries whereby each entry stores complex gain values. Signal transmission apparatus 100 also comprises an indexer 111 which calculates the magnitude of an input signal Vi[n], addresses an entry of LUTs 120 according to the calculated magnitude, and outputs a specific complex gain value (referred to as 'gain value', hereinafter).

OCC 121 calculates an operational characteristic (L[n]) (e.g., estimated value of an actual operational power) from an input signal (S[n]) containing information related to an operation area of nonlinear transmission device 115. Input signal S[n] may be obtained, for example, from the output of nonlinear transmission device 15 using an operational characteristic measuring sensor (not shown) or from a predistorted signal if noise considerations are not of paramount importance. An operational characteristic may be defined, for example, by an operational power level, an operational temperature or a bias value. LUT selector 122 selects a LUT corresponding to a calculated operational characteristic (L[n]), as generally shown in FIG. 3.

Figure 4:
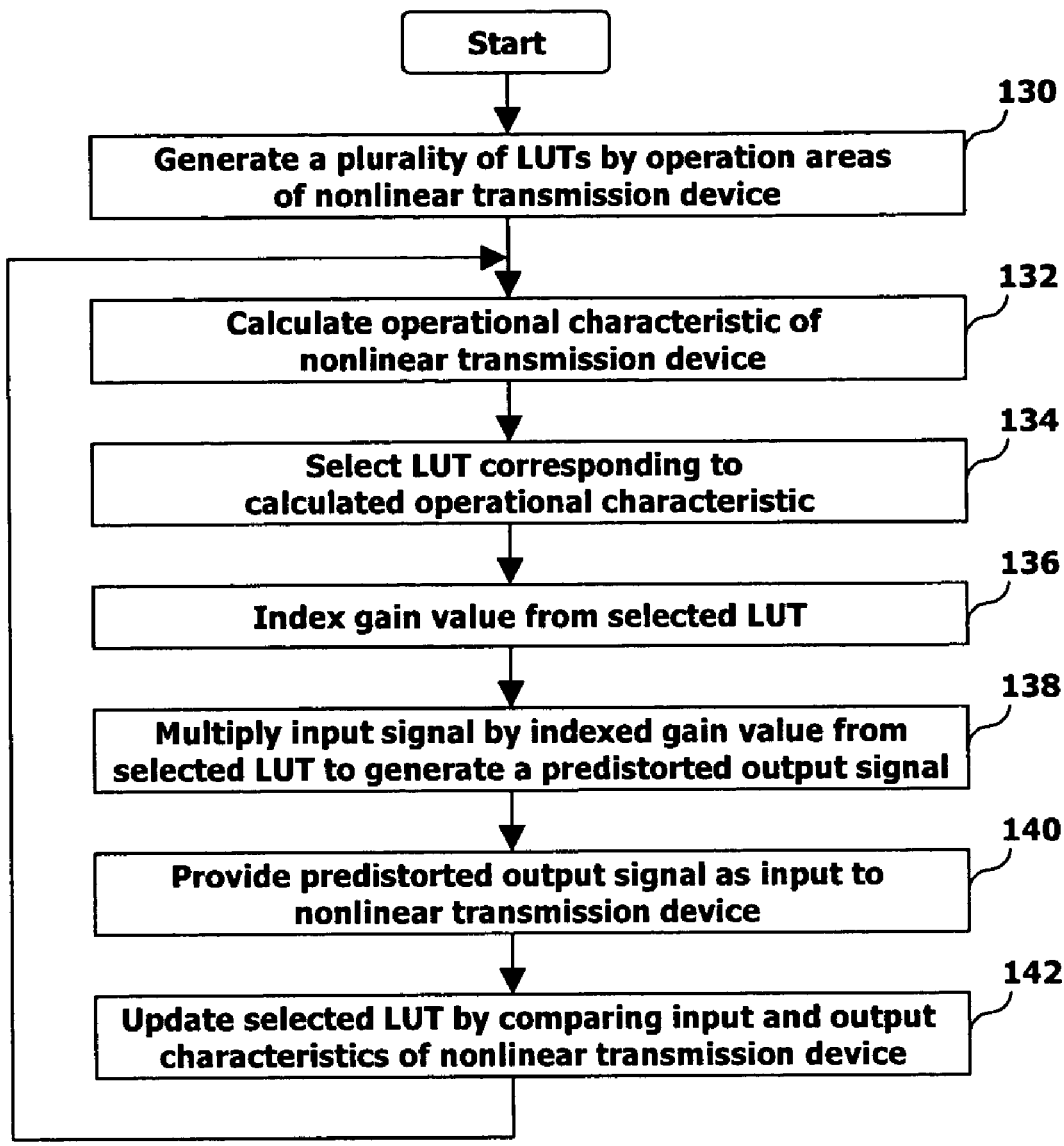
FIG. 4 is an exemplary operational flow chart of the signal transmission apparatus of FIG. 3.

FIG. 4 is one example of an operational flow chart for use in conjunction with signal transmission apparatus 100 of FIG. 3. LUTs 120 are generated by operation areas of nonlinear transmission device 115, step 130. Each LUT includes a plurality of entries storing gain values of input signal magnitudes. OCC 121 calculates a suitable operational characteristic such as the operational power level of nonlinear transmission device 115, step 132. Specifically, OCC 121 periodically calculates the operational power level ((L[n]) by using a weighted moving average of the power level of input signal (S[n]), FIG. 3. Since operational power is not much different from input power, OCC 121 may also calculate an operational characteristic of nonlinear transmission device s15 from a predistorted signal (Vd[n]).

Figure 5:
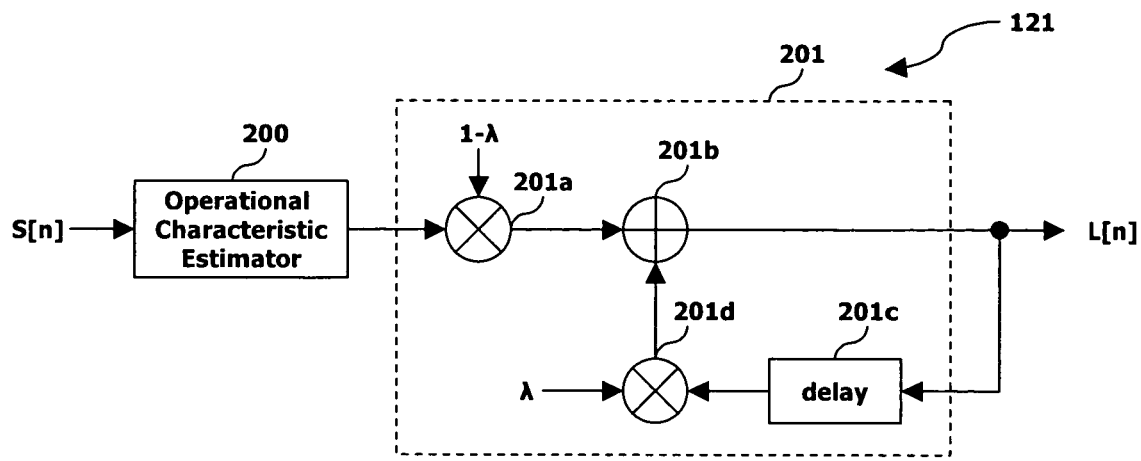
FIG. 5 schematically illustrates the structure of an operational characteristic calculator (OCC) of the signal transmission apparatus of FIG. 3.

As schematically shown in FIG. 5, OCC 121 may include an operational characteristic estimator 200 and an operational characteristic averaging unit 201. The latter calculates an operational characteristic (L[n]) by averaging the estimated operational characteristic and an operational characteristic of a previous period. The estimated operational characteristic may include an instantaneous power value. Operational characteristic averaging unit 201 may include a first multiplier 201a for multiplying a weight value of 1−λ (0<λ<1) to the estimated operational characteristic, a second multiplier 201d for multiplying a weight value of λ to the operational characteristic of the previous period which has been delayed by a delayer 201c, and an adder 201b for generating an operational characteristic (L[n]) of a current period by adding the estimated operational characteristic of the first multiplier 201a and the operational characteristic of the second multiplier 201d. Using a weighted moving average method is advantageous in that an average degree of the estimated operational power, i.e., the instantaneous power value, can be easily controlled by simply changing the value λ.

LUT selector 122 selects a LUT corresponding to the operational characteristic (L[n]) calculated by OCC 121, step 134. LUT selector 122 allows LUTs 120 to operate stably at the boundary between LUTs by applying a guard band concept using hysteresis. The operational characteristic (operational power level) L[n] calculated by OCC 121 may contain a ripple component which may cause LUT selector 122 to frequently select LUTs if the operational characteristic (L[n]) is located near the boundary between LUTs.

Figure 6:
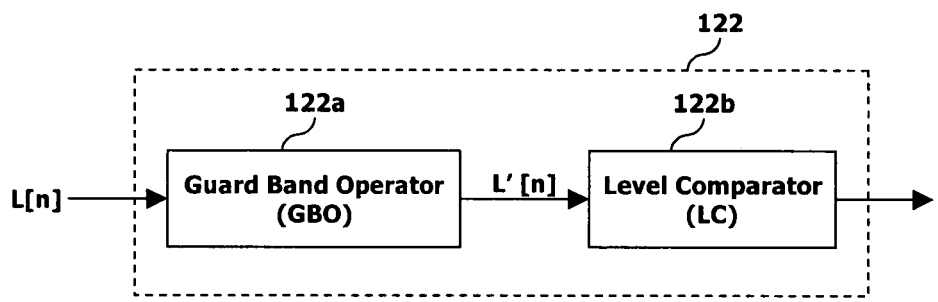
FIG. 6 schematically illustrates the structure of a LUT selector of the signal transmission apparatus of FIG. 3.
Figure 7:
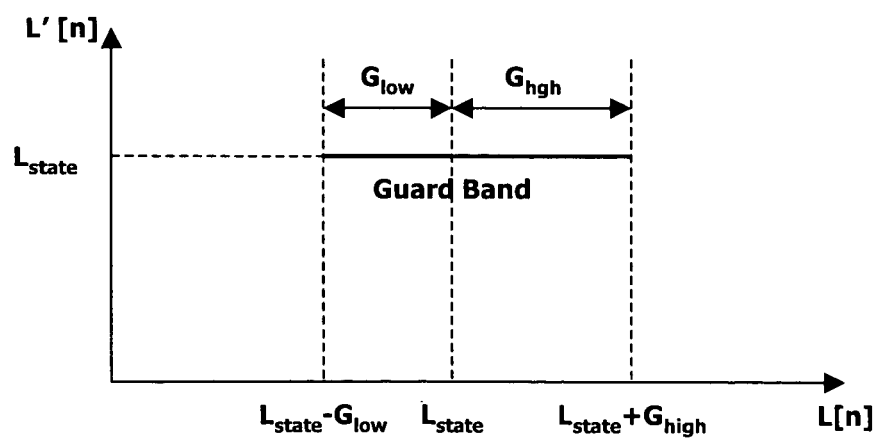
FIG. 7 is a graph showing input/output characteristics of a guard band operator (GBO) of the signal transmission apparatus of FIG. 3.

FIG. 6 schematically illustrates an example of LUT selector 122. Specifically, LUT selector 122 includes a GBO (Guard Band Operator) 122a and a level comparator (LC) 122b. GBO 122a uses hysteresis to prevent the LUT from being frequently changed merely by the ripple when L[n] is located near the boundary between LUTs, so that LUTs 20 can operate stably even at the boundary region between LUTs. For example, if Lstate is set, GBO 122a outputs Lstate when the operational characteristic L[n] is located near Lstate. If the operational characteristic L[n] goes beyond the vicinity of Lstate, GBO 122a sets a corresponding L[n] as a new Lstate and outputs the same. The vicinity of Lstate may be defined as a range between Glow and Ghigh, FIG. 7.

When the operational characteristic L[n] is inputted from OCC 121, GBO 122a checks whether L[n] is within a pre-set guard band. Preferably, the guard band is a region between a minimum threshold value (Glow) and a maximum threshold value (Ghigh) of the operational characteristic reference value Lstate. Upon checking, if the operational characteristic (L[n]) is within the guard band, GBO 122a outputs the operational characteristic reference value (Lstate) as a final operational characteristic (L'[n]), where (L'[n]=Lstate).

If, however, the operational characteristic (L[n]) is not within the guard band, GBO 122a sets a new operational characteristic reference value Lstate' as an operational characteristic (L[n]) and outputs the corresponding operational characteristic (L[n]) as a final operational characteristic (L'[n]), where (L'[n]=L[n]). Then, a guard band is set for the new operational characteristic reference value (Lstate).

Figure 8:
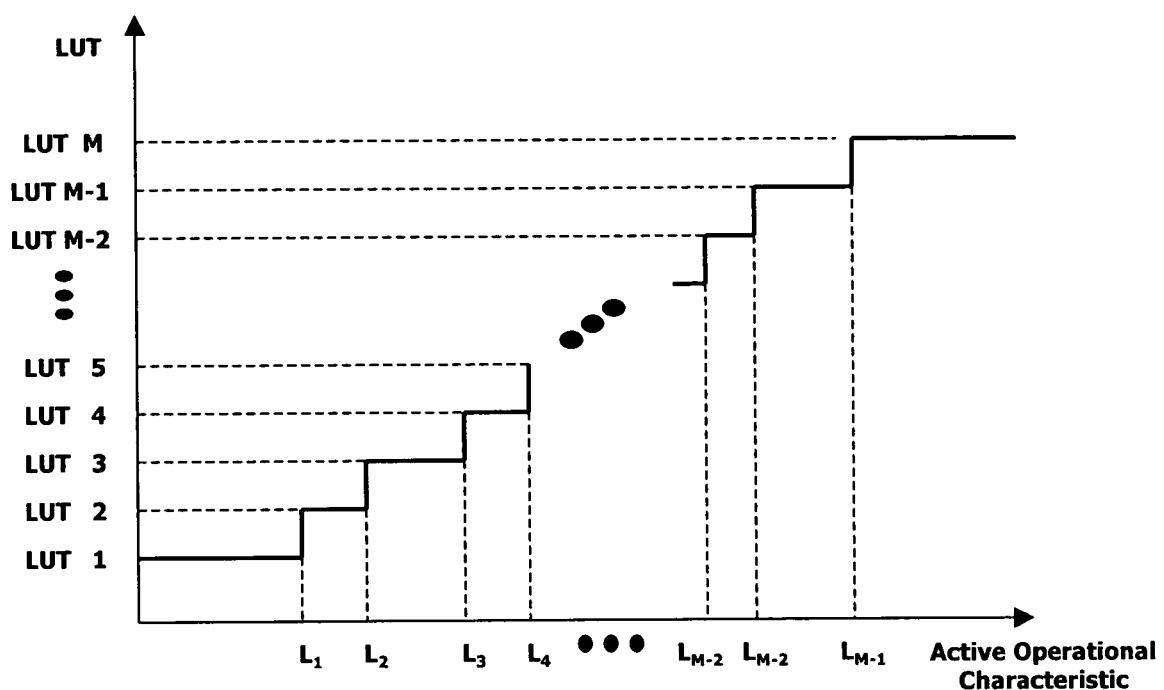
FIG. 8 is a graph showing an exemplary relationship between an active operational characteristic and LUT selection in a level comparator (LC) of the signal transmission apparatus of FIG. 3.

As schematically shown in FIG. 8, level comparator (LC) 122b compares the operational characteristic (L'[n]) which has been calculated by GBO 122a with previously stored representative values of operation areas (referred to as 'active operational characteristics', hereinafter) of each LUT, and selects a LUT corresponding to the operational characteristic (L'[n]). For example, if L'[n] is a value between L2 and L3, LC 122b would select LUT 3 and activate the same.

The active operational characteristics (L1, L2, ..., LM−1) of each LUT are values stored after being set when each LUT of LUTs 120 is initially generated. The active operational characteristics of each LUT are set by an average between adjacent operational characteristics used in generating each LUT and become a boundary value between LUTs. For example, if the operational characteristic (L[n]) of nonlinear transmission device 115 indicates each operation power (P1, P2, ..., PM−1, PM), the active operational characteristics (L1, L2, ..., LM−1) of each LUT are set as (P1+P2)/2, (P2+P3)/2, ..., (PM−1+PM)/2.

Accordingly, when one LUT, e.g., LUT1, is selected from LUTs 120 by LUT selector 122, indexer 111 indexes a gain value (entry) from the selected LUT1, step 136 (FIG. 4), using the magnitude of input signal (Vi[n]) so that a gain value can be outputted from LUT1. Namely, LUT1 is selected as a LUT for compensating the nonlinear characteristics of nonlinear transmission device 115 at the current operational characteristic.

When a gain value is outputted from the selected LUT1, predistorter 112 multiplies input signal Vi(n) by the gain value to generate a predistorted output signal Vd[n], step 138, FIG. 4. The generated Vd[n] is inputted to nonlinear transmission device 115, step 140, FIG. 4, via DAC 113 and UC 114. Nonlinear transmission device 115 amplifies the inputted Vd[n] to a predetermined level and generates an output signal Vf[n], FIG. 3.

Signal transmission apparatus 100 also includes a signal capture module (SCM) 118 which stores Vd[n] (outputted from predistorter 112) and output signal Vf[n] (of nonlinear transmission device 115), which is fed by way of a down frequency converter (DC) 116 and an analog-to-digital converter (ADC) 117. The stored signals are provided as input to a digital signal processor (DSP) 119, as generally shown in FIG. 3. DSP 119 processes the same to estimate the nonlinear characteristics of nonlinear transmission device 115, and then, calculates a complex gain value that has reverse characteristics relative to the estimated nonlinear characteristics, and updates the selected LUT1, step 142, accordingly. In this case, if the LUT is changed while Vd[n] and Vf[n] are being stored, it is advisable not to generate a new LUT on the basis of Vd[n] and Vf[n].

A person skilled in the art would appreciate that indexer 111, OCC 121, and LUT selector 122, although separately provided in reference to FIG. 3, may nevertheless be incorporated into a single integral unit. Furthermore, since each LUT is selected according to a respective operation area of nonlinear transmission device 115, even if the operation area is quickly changed, performance degradation of nonlinear transmission device 115 may be readily prevented. Unstable activation of LUTs that may be generated at the boundary between LUTs when the plurality of LUTs is used may be prevented using hysteresis.

Figure 9:
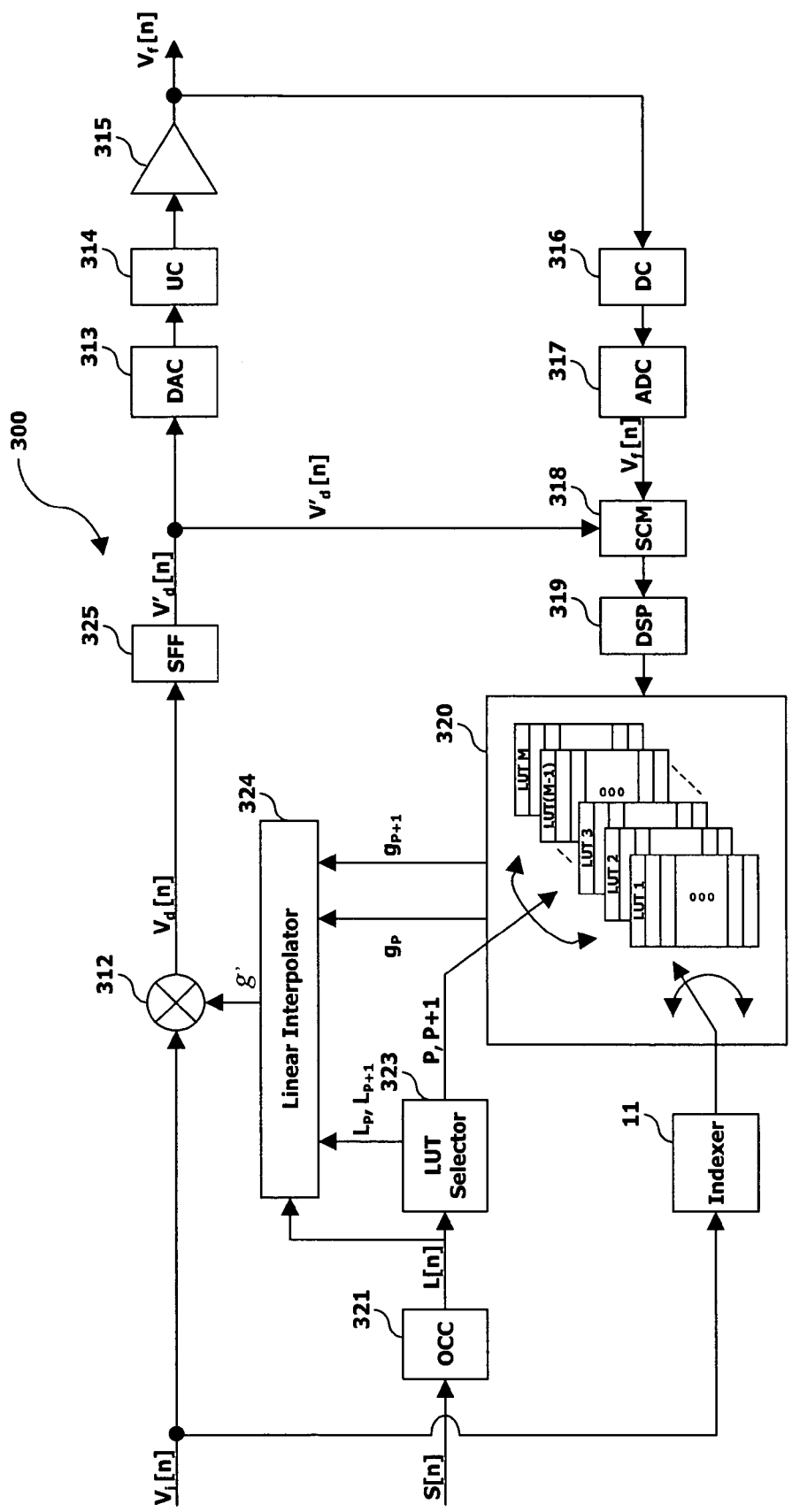
FIG. 9 schematically illustrates a signal transmission apparatus in accordance with another embodiment of the present invention.

FIG. 9 schematically illustrates a signal transmission apparatus 300 in accordance with another preferred embodiment of the present invention. Signal transmission apparatus 300 preferably comprises a plurality of look-up tables (LUTs) 320, instead of a single LUT as practiced in the prior art, an LUT selector 323 operatively coupled between LUTs 320, a linear interpolator 324, and an operational characteristic calculator (OCC) 321. Each of LUTs 320 corresponds to a respective operation area of a nonlinear transmission device 315. Each LUT includes N number of entries whereby each entry stores complex gain values.

LUT selector 323 compares the operational characteristic (L[n]) calculated by OCC 321 with the previously stored active operational characteristics (L1, ..., Lp, Lp+1, ..., LM) of each LUT to select appropriate LUTs, and outputs active operational characteristics of the selected LUTs to linear interpolator 324, as generally shown in FIG. 9. For example, if the operational characteristic (L[n]) satisfies a formula $L_{P-a} \leq L_P \leq L[n] \leq L_{P+1} \leq L_{P+b}$, in case of a spline-type interpolation, LUT selector 323 selects the (a+b+1) number of LUTs from the (P−a)th LUT to (P+b)th LUT, and in case of a linear-type interpolation, LUT selector 323 selects two LUTs (LUT P and LUT P+1) having active operation points (LP, LP+1) in which operational characteristic (L[n]) is an in-between value.

If the operational characteristic (L[n]) calculated by OCC 321 is smaller than the active operational characteristic (L1) of the first LUT (LUT 1), LUT selector 323 selects the first and second LUTs (LUT 1 and LUT 2), and at the same time, transmits the active operational characteristics (L1, L2) to linear interpolator 324. If, however, the operational characteristic (L[n]) is greater than the active operational characteristic (LM) of the last LUT (i.e., the Mth LUT (LUT M)), LUT selector 323 selects the (M−1)th and Mth LUTs (LUT M−1, LUT M) and transfers the corresponding active operational characteristics (LM−1, LM) to linear interpolator 324.

Linear interpolator 324 processes complex gain values (referred to as a 'gain values', hereinafter) indexed in the activated LUT by using the operational characteristic (L[n]) outputted from OCC 321 and the active operational characteristics (LP, LP+1) outputted from LUT selector 323. Linear interpolator 324 outputs a gain compensation value (g') to a predistorter 312, as generally depicted in FIG. 9.

A frequency correction filter, which may be in the form of a spectrum-flattening filter (SFF) 325 (FIG. 9), is included to compensate for the nonlinearity of nonlinear transmission device 315, which varies with frequency. In order to maintain frequency compensation, SFF 325 filters the output signal (Vd[n]) from predistorter 312. For this purpose, a spectrum indicating complex gain values by signal frequency is obtained by passing each signal frequency through nonlinear transmission device 315 at an early stage.

In order to exhibit inverse characteristics of the nonlinear characteristics of nonlinear transmission device 315, an inverse transform function is applied to the spectrum to obtain a filter spectrum. The filter spectrum is inversely fast Fourier transformed (IFFT) so as to be used as an initial filter coefficient of SFF 325. Thereafter, whenever the predistorted signal (Vd[n]) is inputted, the initial filter coefficient of SFF 325 is adaptively updated, thereby compensating for the nonlinear frequency characteristics of nonlinear transmission device 315.

A digital signal processor (DSP) 319 updates the LUT which has an active operational characteristic closest to the operational characteristic (L[n]) using output signal V'd[n] from SFF 325 and output signal Vf[n] from nonlinear transmission device 315 which are stored in a signal capture module (SCM) 318, as generally depicted in FIG. 9. In this respect, however, if the operational characteristic (L[n]) were located in the boundary between active operational characteristics, it would not be advisable to update the LUT. Thus, DSP 319 sets a guard band between a minimum threshold value (LP−Glow) and a maximum threshold value (LP+Ghigh) for the active operational characteristic, and only when the operational characteristic (L[n]) is within the guard band (LP−Glow, LP+Ghigh), DSP 19 updates the LUT (LUT P) having the corresponding active operational characteristic (LP).

Figure 10:
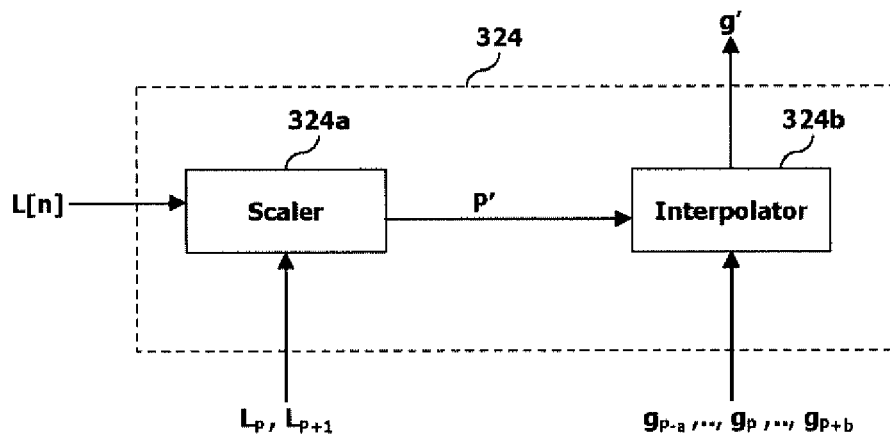
FIG. 10 schematically illustrates one exemplary linear interpolator of the signal transmission apparatus of FIG. 9.
Figure 11A:
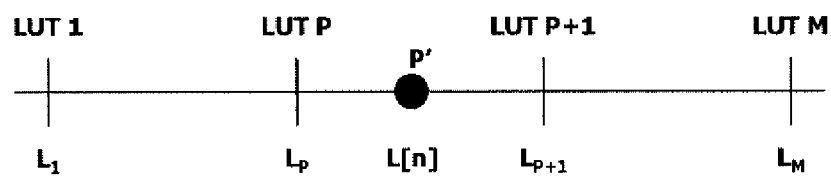
FIGS. 11A and 11B graphically illustrate an example of spline-type interpolation for use by the signal transmission apparatus of FIG. 9.
Figure 11B:
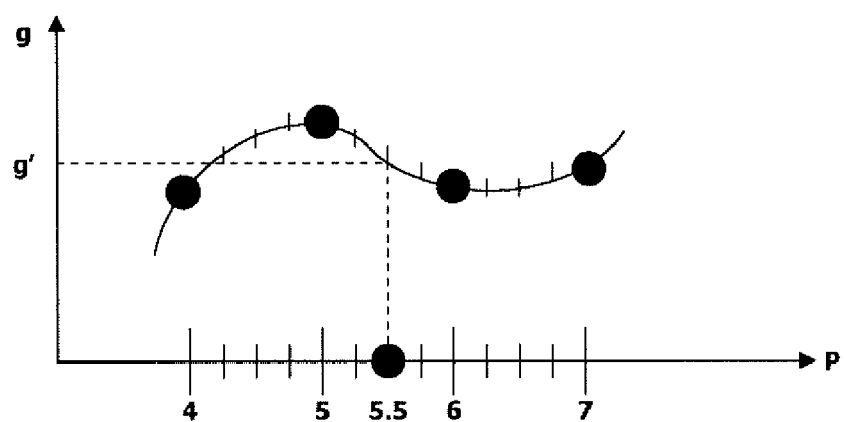

FIG. 10 schematically illustrates an example of a linear interpolator, which uses a spline-type interpolating technique (FIGS. 11A-11B). Specifically, linear interpolator 324 includes a scaler 324a operatively coupled to an interpolator 324b. Scaler 324a determines the position of operational characteristic (L[n]) by comparing the operational characteristic (L[n]) with the active operational characteristics (LP, LP+1) received from OCC 321 and LUT selector 323. As generally shown in FIG. 11A, scaler 324a calculates an interpolation position (P') of operational characteristic (L[n]) between active operational characteristics (LP, LP+1) of LUTs (LUT P LUT P+1) by using the equation: P'=P+(L[n]−LP)/(LP+1−LP). Herein, the interpolation position (P') of operational characteristic (L[n]) is indicated as a decimal point between P and P+1, the selected values of each LUT (LUT P, LUT P+1). Thereafter, interpolator 324b samples the gain values (gP, gP+1) outputted from the LUTs (LUT P, LUT P+1) selected by LUT selector 323, as generally shown in FIG. 11B, and outputs a gain compensation value (g') corresponding to the interpolation position (P').

Figure 12:
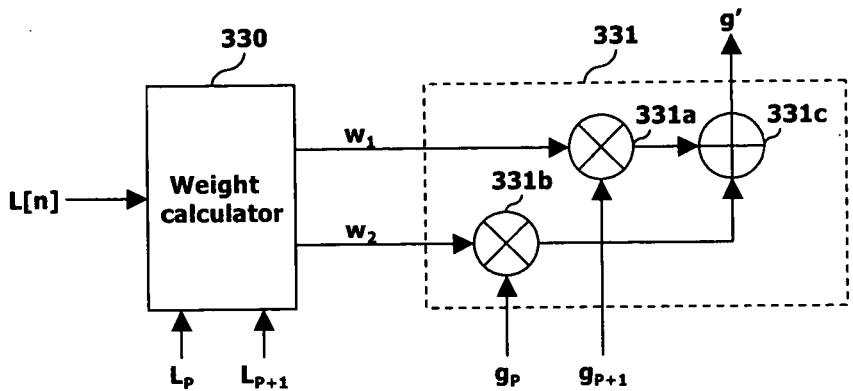
FIG. 12 schematically illustrates another exemplary linear interpolator of the signal transmission apparatus of FIG. 9.

FIG. 12 schematically illustrates another example of a linear interpolator, which uses linear interpolation. Particularly, linear interpolator 324 includes a weight calculator 330 operatively coupled to a weighted adder 331. Weight calculator 330 receives operational characteristic (L[n]) and the active operational characteristics (LP, LP+1), respectively, from OCC 321 and LUT selector 323, and calculates first and second weight values (w1, w2). These weight values are multiplied to the first gain value (gP) indexed from the LUT P having a smaller active operational characteristic (LP) than operational characteristic (L[n]) and the second gain value (gP+1) indexed from the LUT P+1 having a greater active operational characteristic (LP+1) than the operational characteristic (L[n]) according to $$w_1 = \frac{L[n] - L_P}{L_{P+1} - L_P} \text{ and } w_2 = \frac{L_{P+1} - L[n]}{L_{P+1} - L_P}. \quad (1)$$

In order to add a greater weight value to the gain value indexed from the LUT having the active operational characteristic closest to operational characteristic (L[n]), weighted adder 331 multiplies the first weight value (w1) with the second gain value (gP+1), and the second weight value (w2) with the first gain value (gP). Weighted adder 331 includes a first multiplier 331a for multiplying the first weight value (w1) and the second gain (gP+1), a second multiplier 331b for multiplying the second weight value (w2) and the first gain value (gP), and an adder 331c for adding outputs of first and second multipliers 331a and 331b and outputting a linearly interpolated compensation gain value (g').

Besides the above-described spline-type and linear-type interpolation techniques, linear interpolator 324 may be implemented as a digital filter executed by an overlap calculation using a sinc function, which may be obtained by inversely Fourier-transforming a Dirac delta function.

Figure 13:
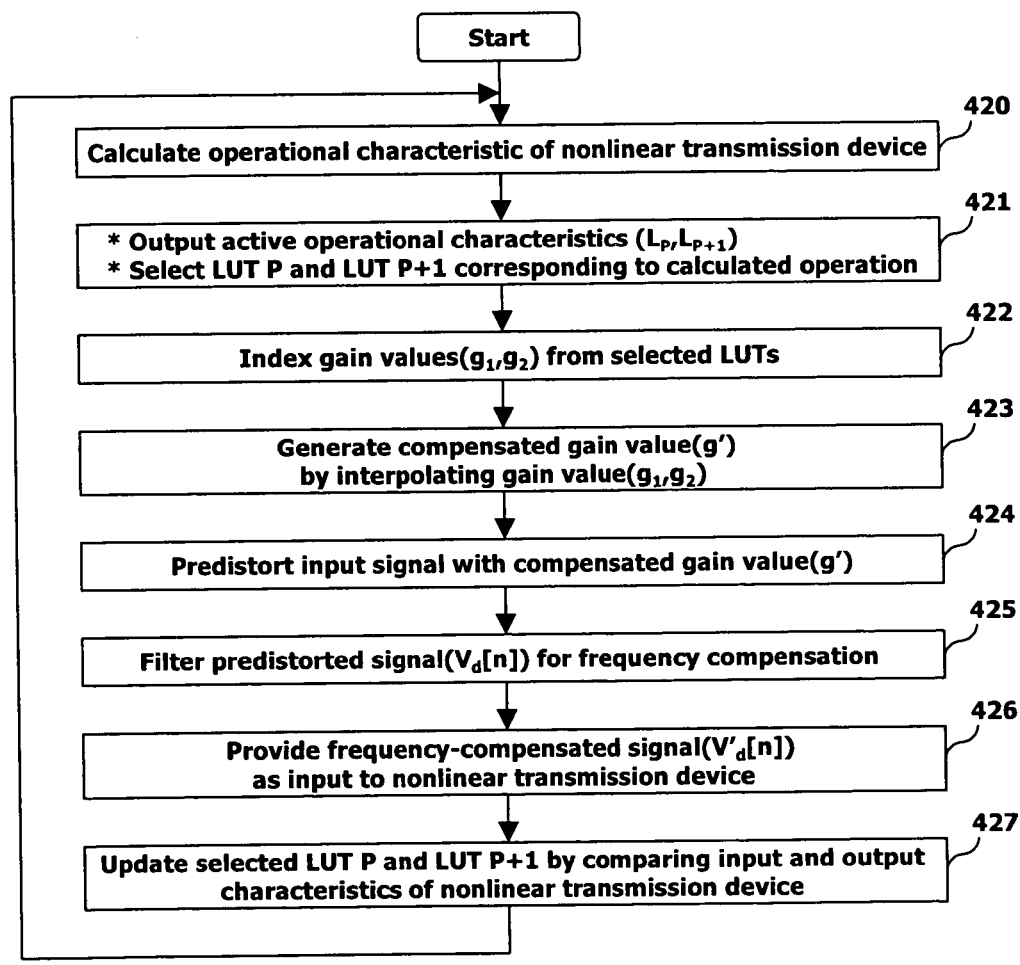
FIG. 13 is an exemplary operational flow chart of the signal transmission apparatus of FIG. 9.

As generally shown in FIG. 13, OCC 321 calculates the operational characteristic L[n] (e.g., operational power level) using a weighted moving average of the power level of input signal (S[n]), which carries information on operational power of nonlinear transmission device 315, step 420. After the operational characteristic L[n] has been calculated, LUT selector 323 compares the calculated operation point (L[n]) with previously stored active operation points (L1, . . . , LP, LP+1, . . . , LM) of LUTs 320.

If L[n] is located between two active operation points ($L_P$, $L_{P+1}$) ($L_P \leq L[n] \leq L_{P+1}$), LUT selector 323 transfers the corresponding active operation points (LP, LP+1) to linear interpolator 324, and selects the Pth and (P+1)th LUTs to activate them, step 421.

Indexer 311 obtains the magnitude of input signal (Vi[n]) and indexes the two activated LUTs (LUT P and LUT P+1) using the obtained magnitude as an address, step 422. Similarly, complex gain values (g1, g2) corresponding to each address are outputted from the LUTs (LUT P and LUT P+1) to linear interpolator 324. Linear interpolator 324 processes the complex gain values (g1 and g2) which have been indexed in the activated LUTs (LUT P and LUT P+1) using operation point (L[n]) and the two active operation points (LP, LP+1), and outputs a compensation gain value (g') which is fed to predistorter 312, step 423.

Predistorter 312 multiplies the compensation gain value (g') with input signal (Vi[N]) to generate a predistorted signal (Vd[N]), step 424. SFF 325 filters the predistorted signal (Vd[N]) for frequency compensation of nonlinear transmission device 315, step 425. Frequency-compensated signal (V'd[n]) is inputted to nonlinear transmission device 315 via a digital-to-analog converter (DAC) 313 and an up converter (UC) 314, step 426. The output signal (Vf[n]) from nonlinear transmission device 315 is inputted to a signal capture module (SCM) 318 via a down converter (DC) 316 and an analog-to-digital converter (ADC) 317.

SCM 318 stores V'd[n] and Vf[n] and outputs the same to a digital signal processor (DSP) 319. DSP 319 processes V'd[n] and Vf[n], calculates a complex gain value having inverse characteristics to the nonlinear characteristics of nonlinear transmission device 315, and updates the LUTs (LUT P and LUT P+1), accordingly.

Figure 14:
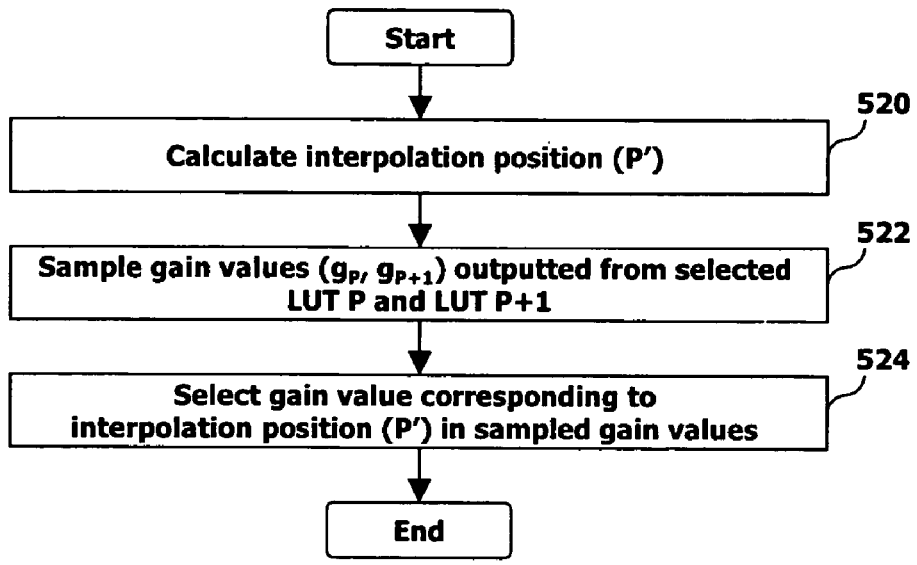
FIG. 14 is a flow chart of one exemplary gain value interpolating procedure for use by the signal transmission apparatus of FIG. 9.

FIG. 14 is a flow chart of an exemplary spline-type interpolating technique. Scaler 324a of linear interpolator 324 calculates the interpolation position (P') according to P'=P+(L[n]−LP)/(LP+1−LP) using the operation area (L[n]) calculated by OCC 321 and the operation areas (LP and LP+1) of the LUTs (LUT P and LUT P+1) selected by LUT selector 323, step 520. Preferably, the interpolation position (P') is an intermediate value between operation areas. Interpolator 324b samples the gain values (gP and gP+1) outputted from the selected LUTS (LUT P and LUT P+1) and outputs a gain value corresponding to the interpolation position (P') as a compensation gain value (g'), steps 522 and 524.

Figure 15:
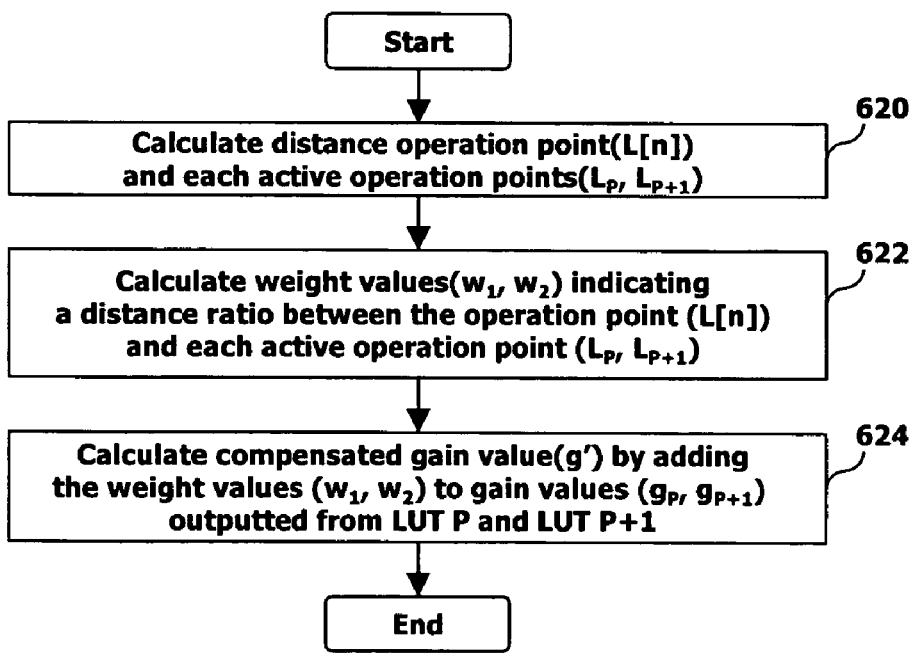
FIG. 15 is a flow chart of another exemplary gain value interpolating procedure for use by the signal transmission apparatus of FIG. 9.

FIG. 15 is a flow chart of an exemplary linear interpolating technique. Weight calculator 330 of linear interpolator 324 receives the operation point (L[n]) calculated by OCC 321 and the active operation points (LP and LP+1) of the LUTs (LUT P and LUT P+1) selected by LUT selector 323, and calculates weight values (w1 and w2) indicating a distance ratio between the operation point (L[n]) and each active operation point (LP and LP+1), step 620. In order to add a greater weight value to a gain value indexed from a LUT having an active operation point closer to the operation point (L[n]), weighted adder 331 multiplies the first weight value (w1) by the second gain value and the second weight value (w2) by the first gain value (gP), step 622. Similarly, the weighted adder 331 calculates a compensated gain value (g') by adding the calculated weight values w1 and w2 to the gain values (gP and gP+1) outputted from the selected LUTs (LUT P and LUT P+1), step 624.

Figure 16:
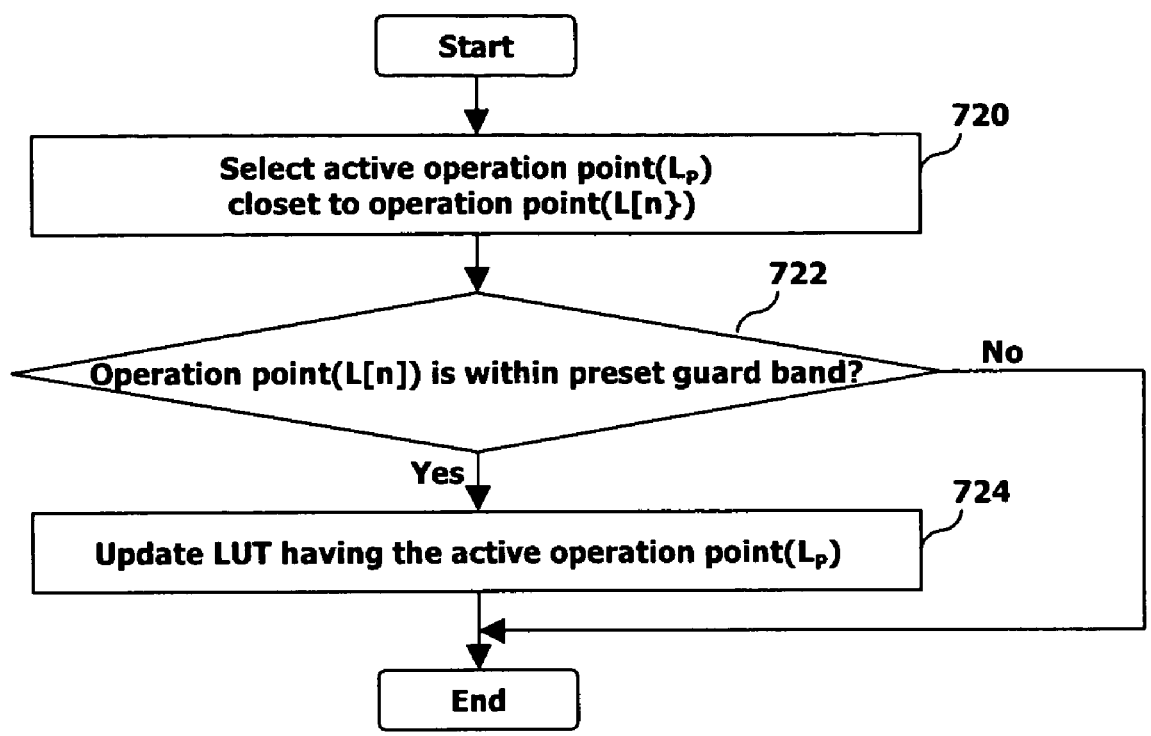
FIG. 16 is a flow chart of an exemplary LUT updating procedure for use by the signal transmission apparatus of FIG. 9.

FIG. 16 is a flow chart of a LUT updating procedure by DSP 319. DSP 319 selects an operation point closer to the operation point (L[n]) calculated by OCC 321 when Vd[N] and Vf[N] are stored in SCM 318 from the active operation points (LP and LP+1) of the two LUTs which have been activated by LUT selector 323, step 720. DSP 319 obtains distances between the operation area (L[n]) and each active operation point (LP and LP+1) and then selects a relatively closer active operation point, for example, selects LP if L[n]−LP<LP+1−L[n]. In addition, DSP 319 checks whether the operation point (L[n]) is within the pre-set guard band (LP−Glow and LP+Ghigh), step 722.

If operation point L[n] is beyond the guard band, i.e. operation point (L[n]) is positioned in the boundary area between the guard bands (LP and LP+1), the LUT updating operation is terminated. If, however, the operation point (L[n]) is a value within the guard band, DSP 319 updates the LUT (LUT P) having the active operation point (LP), step 724.

A person skilled in the art would recognize that the above-described novel signal transmission apparatus may be implemented in a variety of applications. Other components and/or configurations may be utilized in the above-described embodiments.

All terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

While the present invention has been described in detail with regards to several embodiments, it should be appreciated that various modifications and variations may be made in the present invention without departing from the scope or spirit of the invention. In this regard it is important to note that practicing the invention is not limited to the applications described hereinabove.

Many other applications and/or alterations may be utilized provided that such other applications and/or alterations do not deviate from the intended purpose of the present invention. Also, features illustrated or described as part of one embodiment can be used in another embodiment to provide yet another embodiment such that the features are not limited to the embodiments described above. Thus, it is intended that the present invention cover all such embodiments and variations as long as such embodiments and variations come within the scope of the appended claims and their equivalents.

What is claimed is:

1. A signal transmission apparatus, comprising:
   a plurality of look-up tables (LUTs) corresponding to operation areas of a nonlinear transmission device, said plurality of LUTs adapted to store gain values of input signal magnitudes;
   means for calculating an operational characteristic of said nonlinear transmission device from at least one input signal;
   means for selecting a LUT from said plurality of LUTs corresponding to said calculated operational characteristic, said selected LUT adapted to generate a gain value output signal; and
   means for generating a predistorted signal from said gain value output signal and said at least one input signal, said predistorted signal being input to said nonlinear transmission device.

2. The apparatus of claim 1, wherein said nonlinear transmission device is adapted to amplify said input predistorted signal to a predetermined level and generate a corresponding output signal.

3. The apparatus of claim 1, wherein said operational characteristic is an operational power level.

4. The apparatus of claim 1, wherein said operational characteristic is an operational temperature.

5. The apparatus of claim 1, wherein said operational characteristic is a bias point.

6. The apparatus of claim 2, further comprising at least one digital signal processor (DSP) adapted to update at least one gain value in said selected LUT on the basis of said predistorted signal and said output signal of said nonlinear transmission device.

7. The apparatus of claim 1, further comprising means for indexing a gain value stored in said selected LUT using the magnitude of said at least one input signal.

8. The apparatus of claim 6, further comprising at least one signal capture module (SCM) adapted to receive said predistorted signal and said output signal of said nonlinear transmission device and generate a corresponding output signal for input to said at least one DSP.

9. The apparatus of claim 8, wherein said at least one SCM receives said output signal of said nonlinear transmission device by way of at least one analog-to-digital converter (ADC) and at least one down converter (DC).

10. The apparatus of claim 9, wherein said at least one DC is operatively coupled between said nonlinear transmission device and said at least one ADC.

11. The apparatus of claim 1, wherein said means for generating said predistorted signal includes at least one complex multiplier.

12. The apparatus of claim 1, wherein said predistorted signal is being fed to said nonlinear transmission device by way of at least one digital-to-analog converter (DAC) and at least one up converter (UC).

13. The apparatus of claim 12, wherein said at least one UC is operatively coupled between said nonlinear transmission device and said at least one DAC.

14. The apparatus of claim 1, further comprising at least one linear interpolator operatively coupled to said means for selecting said LUT, said plurality of LUTs and said means for generating said predistorted signal, said at least one linear interpolator adapted to process said gain value output signal, said gain value output signal being indexed in said selected LUT, using an operational characteristic output from said means for calculating said operational characteristic and active operational characteristics output from said means for selecting said LUT.

15. The apparatus of claim 14, wherein said processed gain value output signal is being fed to said means for generating said predistorted signal.

16. The apparatus of claim 15, further comprising at least one frequency correction filter operatively coupled between said means for generating said predistorted signal and at least one digital-to-analog converter (DAC).

17. The apparatus of claim 16, further comprising at least one digital signal processor (DSP) adapted to update at least one LUT using output from said at least one frequency correction filter and an output signal from said nonlinear transmission device.

18. The apparatus of claim 17, wherein said at least one linear interpolator includes at least one scaler adapted to determine the position of said operational characteristic output by comparing said operational characteristic output with said active operational characteristics output.

19. The apparatus of claim 17, wherein said at least one linear interpolator includes at least one weight calculator operatively coupled to at least one weighted adder.

20. A signal transmission method, said method comprising the steps of:
  generating a plurality of look-up tables (LUTs) corresponding to operation areas of a nonlinear transmission device, said plurality of LUTs adapted to store gain values of input signal magnitudes;
  calculating an operational characteristic of said nonlinear transmission device from at least one input signal;
  selecting a LUT from said plurality of LUTs corresponding to said calculated operational characteristic, said selected LUT adapted to generate a gain value output signal; and
  generating a predistorted signal from said gain value output signal and said at least one input signal, said predistorted signal being input to said nonlinear transmission device.

21. The method of claim 20, wherein said nonlinear transmission device is adapted to amplify said input predistorted signal to a predetermined level and generate a corresponding output signal.

22. The method of claim 20, wherein said operational characteristic is an operational power level.

23. The method of claim 20, wherein said operational characteristic is an operational temperature.

24. The method of claim 20, wherein said operational characteristic is a bias point.

25. The method of claim 20, further comprising the step of updating at least one gain value in said selected LUT on the basis of said predistorted signal and an output signal of said nonlinear transmission device.

26. The method of claim 20, further comprising the step of indexing a gain value stored in said selected LUT using the magnitude of said at least one input signal.

27. The method of claim 25, further comprising the step of capturing said predistorted signal and said output signal of said nonlinear transmission device.

28. The method of claim 20, further comprising the step of feeding said predistorted signal to said nonlinear transmission device by way of at least one digital-to-analog converter (DAC) and at least one up converter (UC).

29. A signal transmission method, said method comprising the steps of:
  generating a plurality of look-up tables (LUTs) corresponding to operation areas of a nonlinear transmission device, said plurality of LUTs adapted to store gain values of input signal magnitudes;
  calculating an operational characteristic of said nonlinear transmission device from at least one input signal;
  selecting a LUT from said plurality of LUTs corresponding to said calculated operational characteristic, said selected LUT adapted to generate a gain value output signal;
  processing said gain value output signal using at least one linear interpolation technique to generate a processed gain value output signal; and
  generating a predistorted signal from said processed gain value output signal and said at least one input signal, said predistorted signal being input to said nonlinear transmission device.

30. The method of claim 29, wherein said nonlinear transmission device is adapted to amplify said input predistorted signal to a predetermined level and generate a corresponding output signal.

31. The method of claim 29, wherein said operational characteristic is an operational power level.

32. The method of claim 29, wherein said operational characteristic is an operational temperature.

33. The method of claim 29, wherein said operational characteristic is a bias point.

34. The method of claim 29, further comprising the step of updating at least one gain value in said selected LUT on the basis of said predistorted signal and an output signal of said nonlinear transmission device.

35. The method of claim 29, further comprising the step of indexing a gain value stored in said selected LUT using the magnitude of said at least one input signal.

36. The method of claim 34, further comprising the step of capturing said predistorted signal and said output signal of said nonlinear transmission device.

37. The method of claim 29, further comprising the step of feeding said predistorted signal to said nonlinear transmission device by way of at least one digital-to-analog converter (DAC) and at least one up converter (UC).

* * * * *